United States Patent [19]

Imura et al.

[11] Patent Number: 4,556,582
[45] Date of Patent: Dec. 3, 1985

[54] METHOD OF FABRICATING MAGNETIC BUBBLE MEMORY DEVICE

[75] Inventors: Ryo Imura, Sayama; Tadashi Ikeda, Kodaira; Teruaki Takeuchi, Kokubunji; Hiroshi Umezaki, Mitaka; Ryo Suzuki, Kodaira; Yutaka Sugita, Tokorozawa, all of Japan

[73] Assignee: Hitachi, Ltd., Tokyo, Japan

[21] Appl. No.: 375,180

[22] Filed: May 5, 1982

[30] Foreign Application Priority Data

May 11, 1981 [JP] Japan ................................. 56-69440

[51] Int. Cl.[4] .................. B05D 3/06; G11C 19/08
[52] U.S. Cl. ................................... 427/38; 427/127; 365/36
[58] Field of Search ............ 427/38, 131, 130, 127; 204/192 N; 365/36; 357/91

[56] References Cited

U.S. PATENT DOCUMENTS 4,247,781  1/1981  Bayer et al. .................. 250/492 A

OTHER PUBLICATIONS

IEEE Transactions on Magnetics, vol. mag-16, No. 1, Jan. 1980, pp. 93-98, Kie Y. Ahn et al., "Fabrication of Contiguous-Disk Magnetic Bubble Devices".

Primary Examiner—Norman Morgenstern
Assistant Examiner—Ken Jaconetty
Attorney, Agent, or Firm—Antonelli, Terry & Wands

[57] ABSTRACT

A method of fabricating a magnetic bubble memory device is disclosed in which ions are implanted in a desired portion of a surface region in a magnetic bubble film for magnetic bubbles to form a strain layer having a strain of about 1% to about 2.5%, a film is provided on the magnetic bubble film so as to cover the magnetic bubble film with the film and then the magnetic bubble film is annealed under predetermined conditions, thereby providing a practical magnetic bubble memory device having a large bias margin.

14 Claims, 13 Drawing Figures

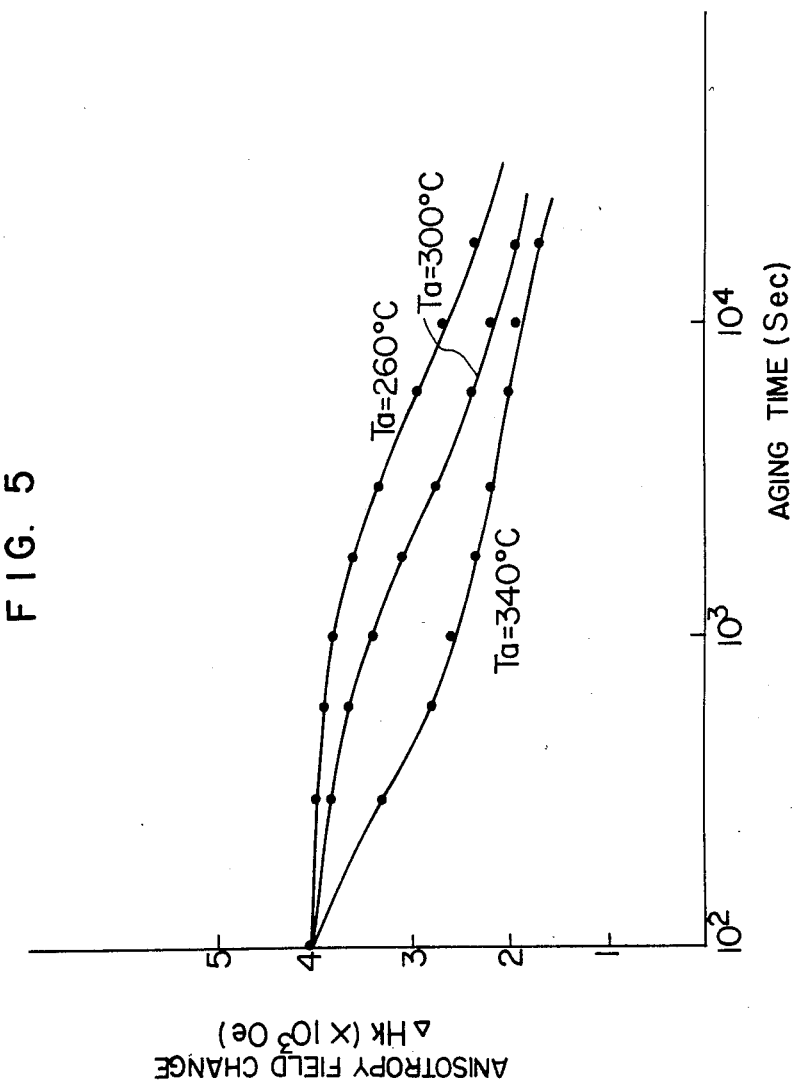

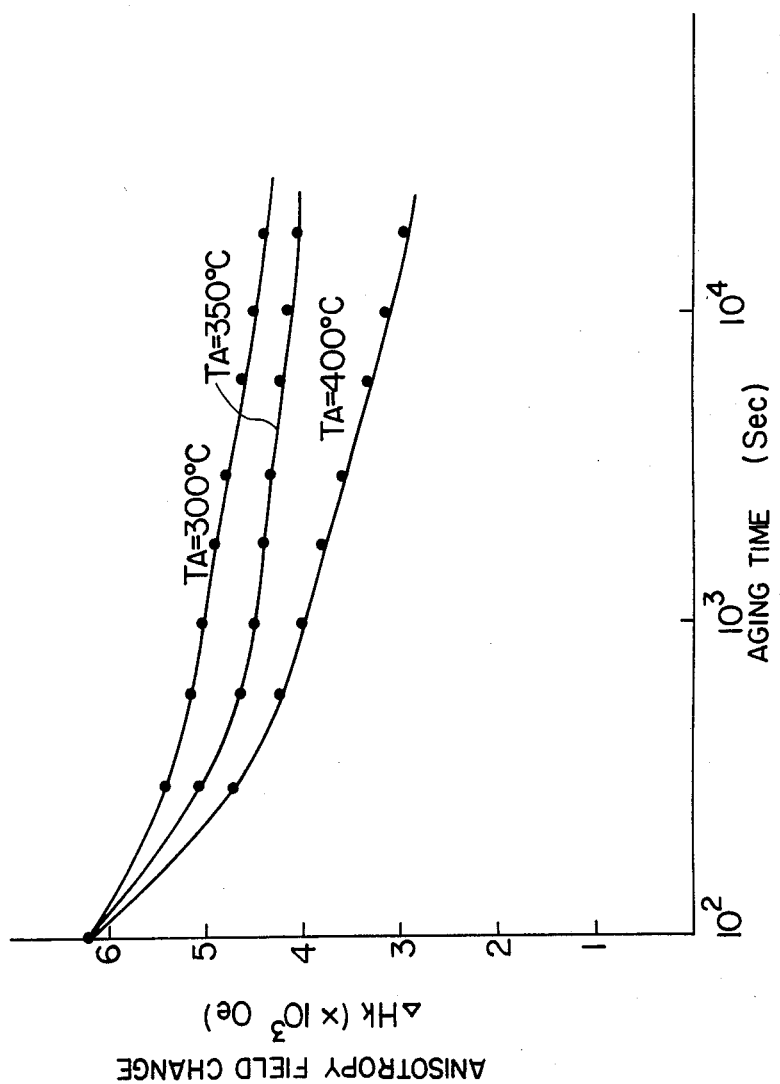

METHOD OF FABRICATING MAGNETIC BUBBLE MEMORY DEVICE

The present invention relates to a method of fabricating a magnetic bubble memory device, and more particularly to a method of forming an ion-implanted layer (namely, a strain layer) in a magnetic bubble memory device of the Contiguous Disk type (hereinafter referred to as a "CD device").

The present invention will be apparent from the following detailed description taken in conjunction with the accompanying drawings, in which:

FIGS. 5 and 6 show relations between $\Delta H_k$ and annealing time for CD devices fabricated by a conventional method, and those for CD devices fabricated in accordance with the present invention, respectively;

A CD device, as disclosed in U.S. Pat. No. 3,828,329 and others, is characterized by having a contiguous disk bubble propagation circuit which is formed by implanting ions into a magnetic bubble film for magnetic bubbles. Since the propagation circuit has no gap, the CD device is considered to be well suited to increase the bit density of magnetic bubble memory device.

Figure 1:
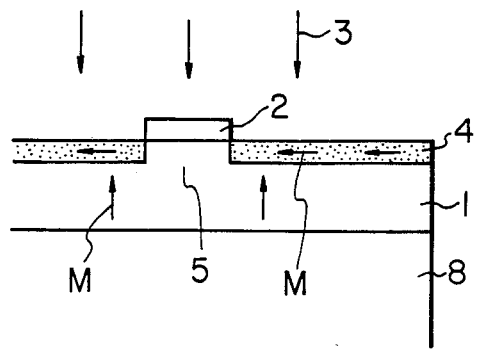
FIGS. 1 and 2 are schematic views for explaining the fabricating method and operation of a CD device, respectively.

As shown in FIG. 1, the contiguous disk bubble propagation circuit is formed in such a manner that a mask 2 formed of a photoresist film or metal film is provided on a magnetic bubble film 1 for supporting magnetic bubbles such as monocrystalline magnetic bubble film, which is formed on a substrate (such as (111) oriented face of $Gd_3Ga_5O_{12}$), and then ions 3 such as hydrogen ions or Ne+ ions are implanted in the magnetic bubble film 1.

In more detail, strain is generated in the magnetic bubble film 1 by the ion implantation, the strain thus generated makes the direction of magnetization M in an ion-implanted region parallel to the surface of the film 1, and an inplane magnetization layer thus obtained (namely, an ion-implanted layer) 4 serves to form a propagation circuit 5.

Figure 2:
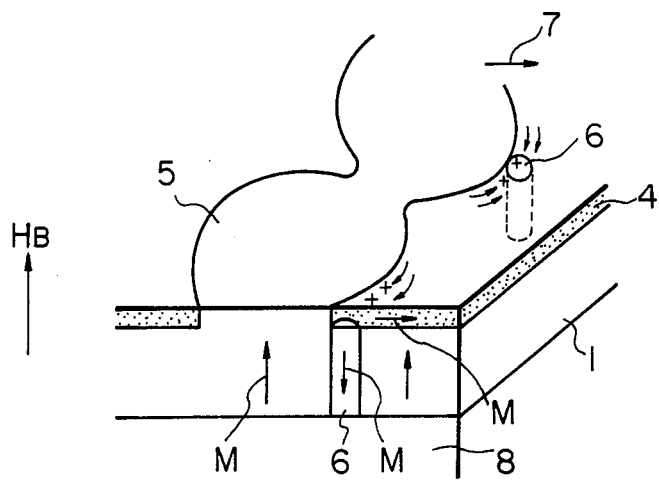

The propagation circuit 5 is a region which has the form of contiguous disks and is not implanted with the ions. A charged wall having magnetic charges is formed on the periphery of the propagation circuit 5, and attracts a magnetic bubble 6 as shown in FIG. 2.

The charged wall is moved along the edge of the propagation circuit 5 by an externally-applied rotating field 7, and thus the magnetic bubble is transferred.

Since the propagation circuit 5, as mentioned previously, has no gap, it is expected that the CD device can be made more than four times higher in bit density than ordinary magnetic bubble memory device through a photolithography technique, that is, has a bit density of about 4 Mb/cm$^2$. Further, it is expected that a magnetic field for driving magnetic bubbles can be greatly reduced.

As mentioned above, in a CD device an ion-implanted layer (namely, a strain layer) formed in a magnetic bubble film plays a very important role. However, in a conventional method, ions are implanted in a desired portion of a surface region in a magnetic bubble film, and the magnetic bubble film thus ion-implanted is annealed as it is to form an inplane magnetization layer.

It is desirable that the above annealing is made at a temperature as high as possible for the thermal stability and long life of a CD device.

However, hydrogen ions and helium ions, which have been implanted in the magnetic bubble film to form the implane magnetization layer, are released by the thermal diffusion to the outside to a great degree, when the bubble film is annealed at a high temperature. That is, it is difficult to raise annealing temperature.

Accordingly, in the conventional method, the CD device is obliged to be annealed at a relatively low temperature, namely, at about 350° C. Therefore, the thermal stability of the inplane magnetization layer is not good, and the long life of the device is not assured. Thus, it is difficult to put the CD device to practical use.

It is accordingly an object of the present invention to provide a method of fabricating a magnetic bubble memory device in which the above-mentioned problem can be solved and a reliable CD device having an inplane magnetization layer with a high thermal stability can be formed.

In order to attain the above object, according to the present invention, ions are implanted in a desired portion of a surface region in a magnetic bubble film to form a strain layer having a maximum strain of about 1% to about 2.5%, the magnetic bubble film is covered with an appropriate film, and then the magnetic bubble film is annealed under predetermined conditions. The above-mentioned strain is a value determined by $\Delta a/a \times 100(\%)$, where a and $\Delta a$ represent the lattice constant and a change of the lattice constant determined through, for example, X-ray analysis.

Now, the present invention will be explained below in detail, while being compared with a conventional method.

Figure 3A:
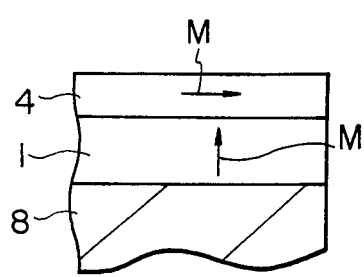
FIGS. 3a and 3b show the formation of a strain layer by a conventional method, and strain distributions before and after annealing in the strain layer.
Figure 3B:
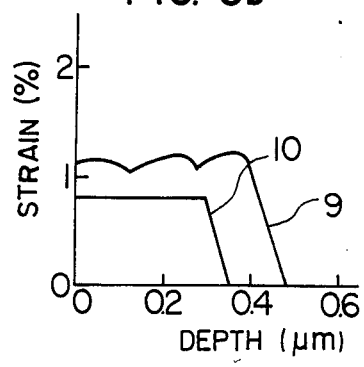
Figure 3C:
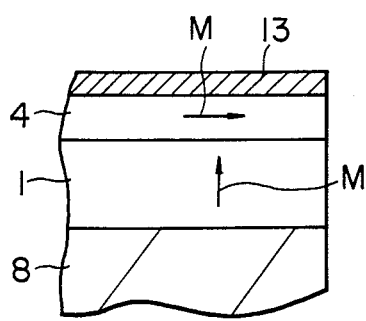
FIGS. 3c and 3d show the formation of a strain layer according to the present invention, and strain distributions before and after annealing in the strain layer.
Figure 3D:
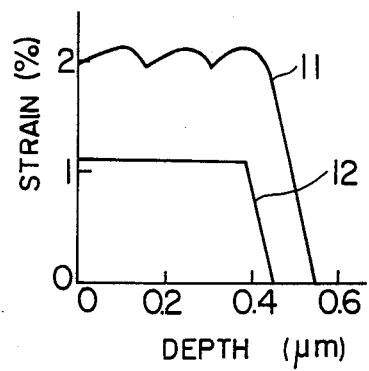

FIGS. 3a and 3b schematically show an ion-implanted layer 4 formed by a conventional method, and strain distributions before and after annealing in the layer 4 in the direction of depth, by way of example, and FIGS. 3c and 3d schematically show an ion-implanted layer formed in accordance with the present invention, and strain distributions before and after annealing in this layer, by way of example.

In FIGS. 3a–3d, reference numeral 8 designates a substrate such as monocrystalline $Gd_3Ga_5O_{12}$, 1 a magnetic bubble film such as a magnetic garnet film formed epitaxially on a (111) crystallographic plane of the substrate 8, 4 an inplane magnetization layer (namely, a strain layer) formed by implanting ions in a surface region of the magnetic bubble film 1, 9 and 11 strain distributions before annealing, 10 and 12 strain distributions after annealing, and 13 an SiO$_2$ film.

Referring to FIGS. 3a and 3b, in the case where hydrogen ions and others are implanted in the magnetic bubble film 1 so as to form the strain layer (namely, the inplane magnetization layer) 4 having a maximum strain of about 1%, and then the bubble film 1 is annealed while keeping the bubble film 1 uncovered with an SiO$_2$ film to smooth the strain distribution in the strain layer 4, the maximum strain is reduced to less than 1%.

Figure 4A:
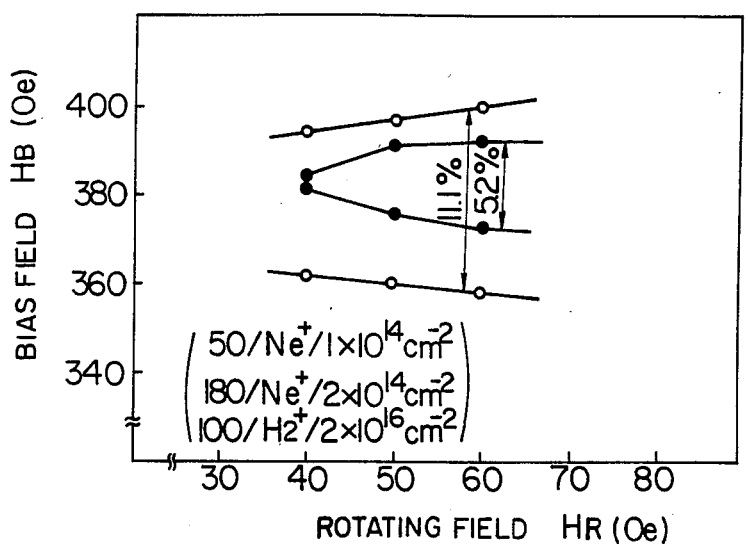
FIGS. 4a and 4b show an example of a change in propagation margin in the case where a CD device is fabricated by a conventional method, and an example of the above change in the case where a CD device is fabricated in accordance with the present invention, respectively.

FIG. 4a shows a propagation margin of a conventional CD device obtained in the above-mentioned manner. In FIG. 4a, marks o and ● indicate a propagation characteristic before annealing and that after annealing, respectively. Further, ion implanting conditions in forming the inplane magnetization layer 4 are shown in the parenthesis of FIG. 4a. In more detail, ion implantation is carried out three times and, for example, a term 50/Ne+/1×10$^{14}$ cm$^{-2}$ shown in the first row indicates that Ne+ ions having an implantation energy of 50 KeV is implanted in the layer 4 with an ion dose of 1×10$^{14}$ cm$^{-2}$.

As shown in FIG. 4a, a propagation margin (that is, a difference between upper and lower limits of a bias field capable of moving a magnetic bubble hormally) is 11.1 percent at a time before annealing. When the CD device is annealed at 350° C. for 30 minutes after the above-mentioned ion implantation, the propagation margin is reduced to about 5.2 percent.

Figure 4B:
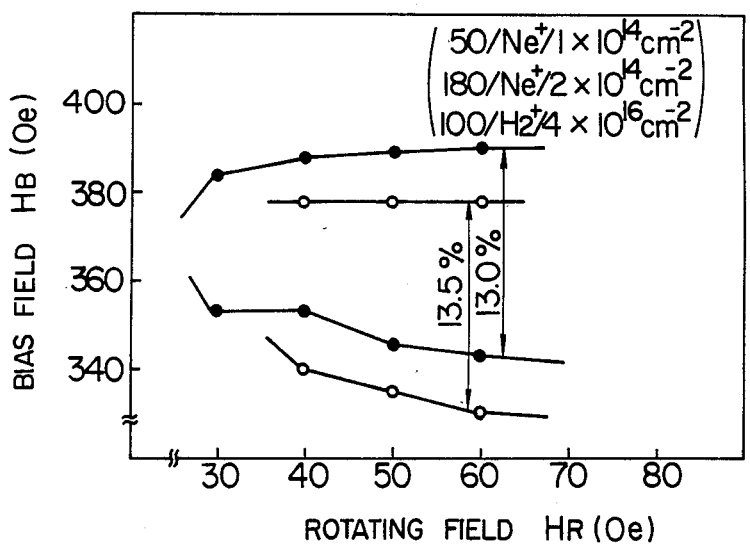

On the other hand, in the case where, in accordance with the present invention, ions are implanted in the magnetic bubble film 1 shown in FIG. 3c under the ion implantation conditions shown in the parenthesis of FIG. 4b, to form the inplane magnetization layer 4 having a maximum strain of about 2% as indicated by the curve 11 in FIG. 3d, the SiO$_2$ film 13 is then provided on the magnetic bubble film 1, and thereafter the film 1 is annealed at 400° C. for 30 minutes, a maximum strain exceeding 1% remains in the layer 4, in spite of the fact that the annealing temperature is higher than in the conventional method.

Further, the propagation margin of the CD device obtained in this case is measured. As shown in FIG. 4b, the propagation margin before annealing and that after annealing are equal to 13.5 percent and 13.0 percent, respectively. That is, a reduction in propagation margin due to annealing is only 0.5 percent. Thus, it is found that the present invention produces a remarkable effect.

Next, the effect of the present invention on the life of a CD device will be explained.

FIG. 5 shows relations between annealing time and anisotropy field change $\Delta H_k$ for various values of annealing temperature Ta, in the case where H$_2$+ ions having an implantation energy of 70 KeV are implanted in a strain layer with an ion dose of 2×10$^{16}$ cm$^{-2}$ to form a CD device. As is apparent from FIG. 5, a reduction in $\Delta H_k$ is great as the annealing temperature (namely, aging temperature) Ta is higher.

Now, let us estimate from the results shown in FIG. 5 a life time of CD devices formed by implanting a hydrogen ion having an implantation energy of 70 KeV in the device with an ion dose of 2×10$^{16}$ cm$^{-2}$. In this case, an activation energy E$_A$ is equal to 0.8 eV, and the life of the device (that is, a time necessary for $\Delta H_k$ to vary by one percent) is estimated to be half a year when the element is held at 100° C.

However, in the case where, in accordance with the present invention, H+ ions having an implant energy of 40 KeV is implanted in a magnetic bubble film with an ion dose of 8×10$^{16}$ cm$^{-2}$ to form a strain layer having a maximum strain of 2%, the strain layer thus formed is covered with an SiO$_2$ film, and CD devices formed in the above manner are annealed at different temperatures, the results shown in FIG. 6 are obtained. The life time of a CD device formed in the above-mentioned manner can be estimated from the results shown in FIG. 6 by the well-known method. In this case, the activation energy E$_A$ is about 2 eV, and the life of the device is estimated to be about 2×10$^7$ years when the element is held at 100° C. Thus, it is found that a CD device according to the present invention has a much longer life than a conventional CD device.

A magnetic bubble memory device is required to have a propagation margin of about 7% or more from a practical point of view. According to the present invention, when a strain layer having a strain of more than 1% is formed and annealing is then made under appropriate conditions, a propagation margin of more than 7% is obtained. However, when strain is made greater than 2.5%, the strain layer becomes amorphous, and is unusable even after annealing. Accordingly, it is preferable that a strain layer formed by ion implantation has a strain of about 1% to about 2.5%.

In the present invention, elements having atomic numbers 1 to 10 can be used to form a strain layer. However, when hydrogen (in other words, H+, H$_2$+, D$_2$+ or D+ ion) is used, the most favorable results are obtained. It is needless to say that only one of the above-mentioned ions may be used, but ion implantation using two or more kinds of ions is effective in smoothing strain distribution.

Figure 7B:
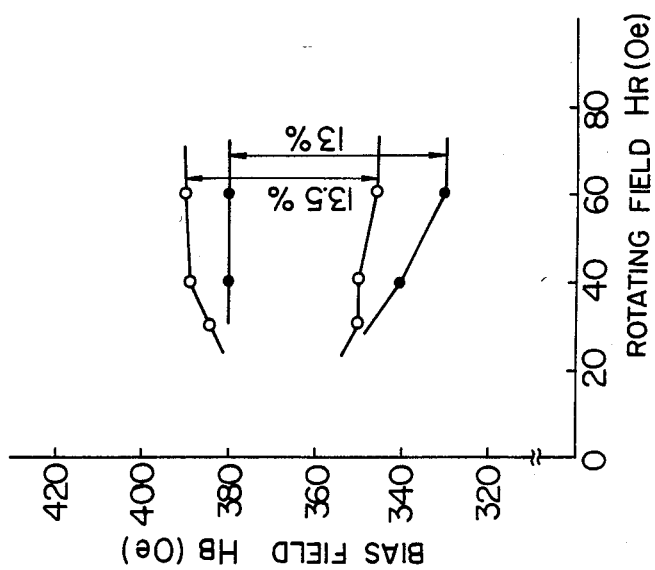
FIGS. 7a and 7b show a change in strain distribution caused by annealing in a CD device fabricated in accordance with the present invention, and a corresponding change in propagation margin, respectively.
Figure 7A:
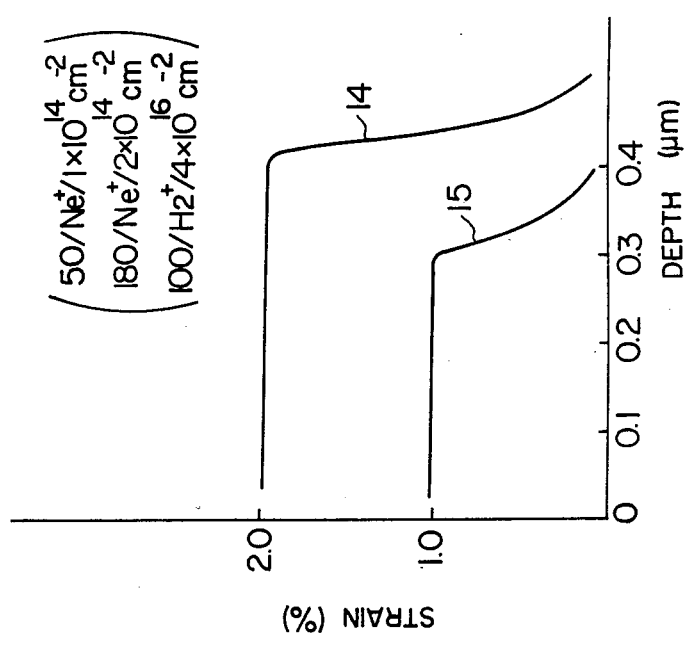

FIG. 7a shows strain distributions in the case where ion implantation is performed three times, that is, Ne+ ions and H$_2$+ ions are implanted under conditions shown in the parenthesis of FIG. 7a. In FIG. 7a, curves 14 and 15 indicate a strain distribution in a strain layer subjected to the above-mentioned ion implantation at a time before annealing, and a strain distribution in this strain layer at a time after an SiO$_2$ film according to the present invention is provided and the strain layer is then annealed at 400° C. for 30 minutes, respectively.

Further, FIG. 7b shows a propagation margin of a CD device which has been subjected to the above-mentioned ion implantation, at a time before annealing, and a propagation margin of the CD device at a time after the above-mentioned annealing has been made. In FIG. 7b, marks o and ● indicate a propagation characteristic of the CD device before annealing and that after the above-mentioned annealing, respectively.

As is apparent from FIGS. 7a and 7b, in the case where, according to the present invention, a strain layer having a maximum strain of about 2% is formed by ion implantation and then annealing is made under the above-mentioned conditions, a strain of about 1% remains in the strain layer and a propagation margin of 13% is obtained. That is, it is found that a reduction in propagation margin due to annealing is very small.

The conditions, under which annealing has to be carried out after ion implantation, are very important in the present invention. When annealing conditions in forming a CD device are outside a predetermined range in FIG. 8, the propagation margin of the CD device is low, and therefore it is difficult to put the element to practical use. This fact will be explained below in detail.

A great number of CD devices according to the present invention were fabricated in such a manner that hydrogen ions were implanted in a surface region of a magnetic bubble film for magnetic bubbles to form a strain layer having a maximum strain of 1 to 2.5% and then heat treatment was carried out at one of various annealing temperatures for a time selected from various annealing times, and the propagation margin of each of the above CD devices was measured. The results of measurements are shown in Table 1. In Table 1, CD devices having a propagation margin of 7% or more are indicated by a mark o, and those having a propagation margin of less than 7% are indicated by a mark x.

TABLE 1

| Sample No. | Annealing temperature (°C.) | Annealing time (sec) | Propagation margin (%) | Judgement |
| --- | --- | --- | --- | --- |
| 1 | 200 | $2 \times 10^5$ | 6.5 | x |
| 2 | 200 | $1.8 \times 10^4$ | 5.5 | x |
| 3 | 250 | $3.6 \times 10^5$ | 6.8 | x |
| 4 | 300 | $9 \times 10^5$ | 8.2 | o |
| 5 | 300 | $1 \times 10^5$ | 7.5 | o |
| 6 | 300 | $1.8 \times 10^4$ | 6.8 | x |
| 7 | 300 | $8 \times 10^2$ | 6.0 | x |
| 8 | 300 | $2 \times 10^2$ | 5.5 | x |
| 9 | 350 | $1 \times 10^6$ | 6.8 | x |
| 10 | 350 | $1 \times 10^4$ | 10.5 | o |
| 11 | 350 | $2 \times 10^3$ | 7.5 | o |
| 12 | 350 | $1.8 \times 10^3$ | 6.8 | x |
| 13 | 350 | $2 \times 10^2$ | 5.5 | x |
| 14 | 400 | $2 \times 10^5$ | 2.3 | x |
| 15 | 400 | $7 \times 10^4$ | 12.0 | o |
| 16 | 400 | $1 \times 10^4$ | 12.5 | o |
| 17 | 400 | $1 \times 10^3$ | 13.0 | o |
| 18 | 400 | $6 \times 10^2$ | 12.5 | o |
| 19 | 400 | $2 \times 10^2$ | 6.8 | x |
| 20 | 400 | $6 \times 10$ | 5.5 | x |
| 21 | 500 | $1 \times 10^4$ | 4.0 | x |
| 22 | 500 | $7.2 \times 10^3$ | 9.6 | o |
| 23 | 500 | $3.6 \times 10^3$ | 10.0 | o |
| 24 | 500 | $3.6 \times 10^2$ | 12.0 | o |
| 25 | 500 | $6 \times 10$ | 10.5 | o |
| 26 | 500 | $4 \times 10$ | 6.8 | x |
| 27 | 600 | $3.6 \times 10^3$ | 3.5 | x |
| 28 | 600 | $1.8 \times 10^3$ | 9.6 | o |
| 29 | 600 | $9 \times 10^2$ | 12.5 | o |
| 30 | 600 | $6 \times 10$ | 11.0 | o |
| 31 | 600 | $1.2 \times 10$ | 7.5 | o |
| 32 | 600 | 1 | 5.5 | x |
| 33 | 700 | $1 \times 10^3$ | 1.5 | x |
| 34 | 700 | $6 \times 10^2$ | 9.6 | o |
| 35 | 700 | $6 \times 10$ | 8.0 | o |
| 36 | 700 | 4 | 7.0 | o |
| 37 | 750 | 9 | 9.6 | o |
| 38 | 800 | $8 \times 10^2$ | 0 | x |
| 39 | 800 | $3.6 \times 10^2$ | 7.5 | o |
| 40 | 800 | $2 \times 10^2$ | 10.5 | o |
| 41 | 800 | $6 \times 10$ | 7.8 | o |
| 42 | 800 | 6 | 7.2 | o |
| 43 | 800 | 1.6 | 7.0 | o |
| 44 | 800 | 0.3 | 5.5 | x |

Figure 8:
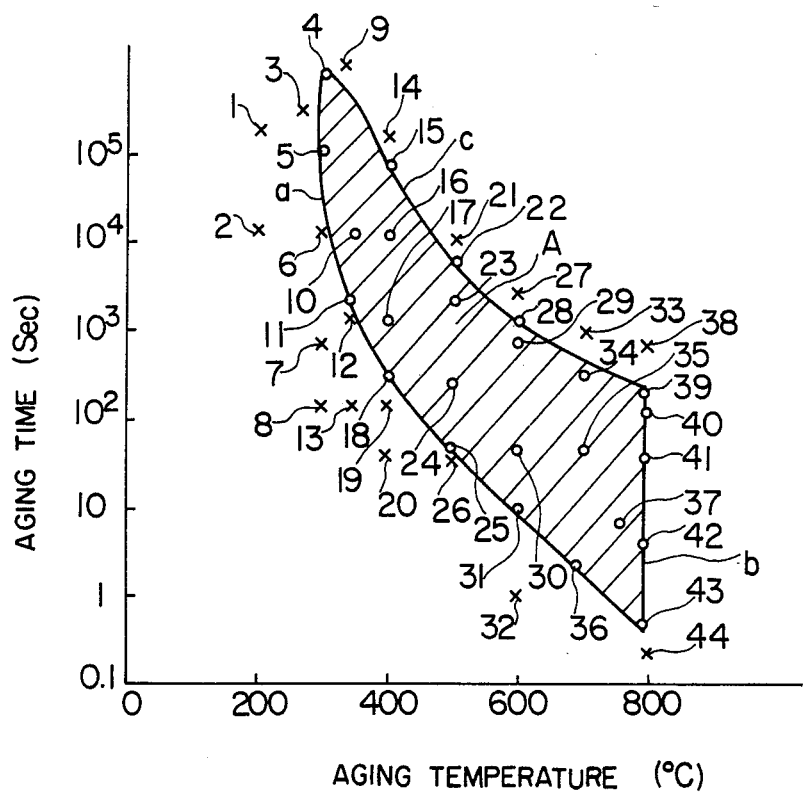
FIG. 8 is a graph for showing annealing conditions preferably used in the present invention.

FIG. 8 is a graph showing the experimental results described in Table 1. Numbers 1 to 44 in FIG. 8 correspond to sample numbers 1 to 44 in Table 1, and marks o and x in FIG. 8 have the same meanings as those in Table 1.

Referring to FIG. 8, a hatched region A, which is bounded by a line segment a connecting the points 4, 5, 11, 18, 25, 36 and 43, a line segment b connecting the points 43, 42, 41, 40 and 39, and a line segment c connecting the points 39, 28, 22, 15 and 4, indicates annealing conditions for producing a favorable propagation margin. Accordingly, when a strain layer having a strain of 1 to 2.5% is formed in a CD device by ion implantation and the CD device is annealed under conditions given by a point within the hatched region A, the CD device has a propagation margin of 7% or more, and therefore can operate satisfactorily.

Accordingly, in the present invention, it is required that an annealing time (namely, aging time) and an annealing temperature (namely, aging temperature) at the heat treatment carried out after ion implantation lie within the region A shown in FIG. 8.

Further, in order to prevent ions implanted in a strain layer from releasing at an annealing time, it is preferable to provide a film at least on magnetic bubble film prior to annealing.

Such a film may be, for example, one of insulating films such as an $SiO_2$ film, an $Si_3N_4$ film and an $Al_2O_3$ film, one of metal films such as an aluminum film, a molybdenum film, a chromium film and a nickel film, or a polycrystalline silicon film.

In the case where an insulating film such as an $SiO_2$ film is used, when the thickness of the insulating film is made greater than about 50 Å and smaller than 1 μm, it is possible to effectively prevent hydrogen ions implanted in a strain layer from releasing. Especially, an insulating film having a thickness of 500 to 3,000 Å can serve as an insulating film for a magnetic bubble memory device as it is, in addition to acting as an ion release preventing film, and therefore is desirable from a practical point of view.

In a CD device, a magnetic bubble film has a thickness of about 0.3 μm to about 2.5 μm, and an ion-implanted region is formed so as to have a thickness of one-fifth to one-half the above thickness.

Accordingly, in the case where $H_2{}^+$ ion is used as an implantation ion, $H_2{}^+$ ion having an implantation energy of 15 to 400 KeV is implanted in a strain layer with an ion dose of $2 \times 10^{16}$ to $1 \times 10^{17}$ cm$^{-2}$ in order to form a strain layer having a strain of about 1% to about 2.5% in a surface region of a magnetic bubble film extending from the upper surface thereof to a depth of 0.06 to 1.25 μm. After $H_2{}^+$ ion has been implanted under the above conditions, one selected from the above-mentioned films, for example, an $SiO_2$ film is provided on magnetic bubble film and then annealing is made under such conditions as indicated by a point within the region A shown in FIG. 8. Thus, a favorable CD device can be obtained which has a large propagation margin.

In the present invention, the magnetic bubble film may be made of one of various kinds of materials and is typically a monocrystalline magnetic garnet film such as of $(YSmLuCa)_3(FeGe)_5O_{12}$, $(YSmLuGd)_3(FeGa)_5O_{12}$ or another material heretofore known as a garnet film material for a magnetic bubble device. As for other kinds of materials for the magnetic bubble film different from the monocrystalline garnet film, there are orthoferrite or amorphous Gd-Co films and other films capable of supporting magnetic bubbles.

What is claimed is:
1. In a method of fabricating a magnetic bubble memory device comprising the steps of implanting ions in a desired portion of a surface region in a magnetic bubble film for magnetic bubbles and annealing said magnetic bubble film, the improvement comprising:
 (a) said implanting ions in a desired portion of a surface region being performed to form a strain layer having a strain of about 1% to about 2.5%;
 (b) providing a film on said magnetic bubble film after the ion implanting step to cover said magnetic bubble film with said film; and
 (c) said annealing said magnetic bubble film being performed after providing the film on the magnetic bubble film, and is performed at a temperature for a time, said annealing temperature and said annealing time being indicated by a point within a region shown in FIG. 8, whereby, by implanting ions to form a strain layer having a strain of about 1% to about 2.5% and by annealing said magnetic bubble film at an annealing temperature and time within a region A shown in FIG. 8, reduction in propagation margin due to annealing is low and a device having a propagation margin of 7% or more can be provided.

2. A method according to claim 1, wherein said ions are hydrogen ions.

3. A method according to claim 2, wherein hydrogen ions having an implantation energy of 15 to 400 KeV are implanted in said desired portion with an ion dose of $2 \times 10^{16}$ to $1 \times 10^{17}$ cm$^{-2}$.

4. A method according to claim 1, wherein said ions implanted in said implanting step are hydrogen ions and ions of at least one element having atomic number of 1 to 10.

5. A method according to claim 2, 3 or 4, wherein said film is made of at least one selected from a group consisting of $SiO_2$, $Si_3N_4$, $Al_2O_3$, polycrystalline silicon, aluminum, molybdenum, chromium and nickel.

6. A method according to claim 1 or 4 wherein said film is selected from an $SiO_2$ film, an $Si_3N_4$ film and an $Al_2O_3$ film, each of which has a thickness of 0.005 to 1.0 μm.

7. A method according to claim 1 or 4 wherein the thickness of said strain layer lies in a range from about one-fifth to about one-half the thickness of said magnetic bubble film.

8. A method according to claim 4, wherein said ions are ions of hydrogen and of at least one other element having atomic number of 2 to 10.

9. A method according to claim 5, wherein said implanting step includes three ion implantation substeps.

10. A method according to claim 9, wherein the three ion implantation substeps include a first implantation of Ne$^+$ ions, a second ion implantation of Ne$^+$ ions, and a third ion implantation of H$_2^+$ ions.

11. A method according to claim 9, wherein said ions implanted in the three ion implantation substeps are hydrogen and at least one other element having atomic number of 2 to 10.

12. A method according to claim 2, 4, 8 or 11, wherein said hydrogen ions are selected from the group consisting of H$^+$, H$_2^+$, D$_2^+$ and D$^+$.

13. A method according to claim 7, wherein the magnetic bubble film has a thickness of about 0.3 μm to about 2.5 μm.

14. A method according to claim 4, wherein said film is selected from SiO$_2$ film, an Si$_3$N$_4$ film and an Al$_2$O$_3$ film, each of which has a thickness of 0.005 to 1.0 μm.

* * * * *